US008115379B2

(12) United States Patent
Hartmann et al.

(10) Patent No.: US 8,115,379 B2
(45) Date of Patent: Feb. 14, 2012

(54) USE OF METAL COMPLEXES AS EMITTER IN AN ORGANIC LIGHT-EMITTING COMPONENT AND SUCH A COMPONENT

(75) Inventors: Horst Hartmann, Dresden (DE); Hartmut Yersin, Sinzing (DE)

(73) Assignee: Novaled AG, Dresden (DE)

( * ) Notice: Subject to any disclaimer, the term of this patent is extended or adjusted under 35 U.S.C. 154(b) by 765 days.

(21) Appl. No.: 12/159,520

(22) PCT Filed: Dec. 22, 2006

(86) PCT No.: PCT/DE2006/002330
§ 371 (c)(1),
(2), (4) Date: Nov. 10, 2008

(87) PCT Pub. No.: WO2007/073728
PCT Pub. Date: Jul. 5, 2007

(65) Prior Publication Data
US 2009/0318698 A1 Dec. 24, 2009

(30) Foreign Application Priority Data
Dec. 28, 2005 (EP) ..................... 05028570

(51) Int. Cl.
*H01L 51/50* (2006.01)
*C07F 15/00* (2006.01)
(52) U.S. Cl. ............... 313/504; 546/2; 428/690
(58) Field of Classification Search ...... 546/2; 313/504; 428/690
See application file for complete search history.

(56) References Cited

U.S. PATENT DOCUMENTS

| 5,792,568 | A | 8/1998 | Emoto et al. |
|---|---|---|---|
| 6,908,783 | B1 | 6/2005 | Kuehl et al. |
| 6,984,591 | B1 | 1/2006 | Buchanan et al. |
| 2002/0042174 | A1 | 4/2002 | Kunugi et al. |
| 2002/0179885 | A1 | 12/2002 | Che et al. |
| 2003/0186080 | A1 | 10/2003 | Kamatani et al. |
| 2003/0205707 | A1 | 11/2003 | Chi-Ming et al. |
| 2004/0065544 | A1 | 4/2004 | Igarashi et al. |
| 2004/0121184 | A1 | 6/2004 | Thompson et al. |
| 2004/0241492 | A1 | 12/2004 | Tokuda |
| 2004/0262576 | A1 | 12/2004 | Thompson et al. |
| 2005/0221115 | A1 | 10/2005 | Tsuboyama et al. |
| 2005/0260449 | A1 | 11/2005 | Walters et al. |
| 2006/0071206 | A1 | 6/2006 | Spreitzer et al. |
| 2006/0208252 | A1 | 9/2006 | Wessels et al. |
| 2006/0258043 | A1 | 11/2006 | Bold et al. |
| 2007/0111025 | A1 | 5/2007 | Lennartz et al. |
| 2007/0135635 | A1 | 6/2007 | Stoessel et al. |
| 2007/0264524 | A1 | 11/2007 | Gessner et al. |
| 2008/0121870 | A1 | 5/2008 | Seth et al. |

FOREIGN PATENT DOCUMENTS

| DE | 4112793 | 10/1992 |
|---|---|---|
| GB | 1436230 | 5/1976 |
| JP | 03208689 | 9/1991 |
| WO | WO 2004/017043 | 2/2004 |
| WO | WO 2005/086251 | 9/2005 |

OTHER PUBLICATIONS

Fuchita, Y. et al.: Organogold complexes derived from auration reactions of thienyl-substituted pyridine derivatives. J. Chem. Soc., pp. 4431-4435, 1999.*
Nonoyama, M. et al.: Cyclometallation of 2-(2-thienyl)pyridine and 2-(3-thienyl)pyridine with palladium, rhodium and ruthenium. Trans. Metal Chem., vol. 6, pp. 163-165, 1981.*
Das, V.G. Kumar et al.: Studies on C-heterocyclic tin compounds. The synthesis and spectral characterization of some thienyl tetraorganotin compounds. J. Organomet. Chem., vol. 334, pp. 307-322, 1987.*
Adachi, C. et al. "High-efficiency red electrophosphorescence devices," Appl. Phys. Lett. 2001, 78, 1622.
Beckert, R. et al., "Syntheses and properties of cycloamidines based on 4H-imidazoles," Z. Naturforschung B, vol. 61, No. 4 (2006).
Blochwitz, J., et al., "Low voltage organic light emitting diodes featuring doped phthalocyanine as hole transport material," Applied Physics Letters, vol. 73, No. 6, Aug. 10, 1998, pp. 729-731.
Chassot, L. and Von Zelewsky, A., "Cyclometalated Complexes of Platinum (II): Homoleptic Compounds with Aromatic C, N Ligands," Inorg. Chem. (1987), 26, 2814-2818.
Cocchi, M. et al., "Highly efficient organic electroluminescent devices based on cyclometallated platinum complexes as new phosphorent emitters," Synthetic Metals, 147, 253-256, (2004).
Cocchi, M. et al., "Highly efficient organic electroluminescent light-emitting diodes with a reduced quantum efficiency roll off at large current densities," Applied Physics Letters, 84, 7, 1052-1054 (2004).
Davison, A. et al., "Further Examples of Complexes Related by Electron-Transfer Reactions: Complexes Derived from Bis9trifluoromethyl)-1,2-dithietene," Iorg. Chem. (1964) 3/6 p. 814.
Denmark, S. et al., "Cyclopropanation with Diazomethane and Bis(Oxazoline) Palladium (II) Complexes," Journal of Organic Chemistry, 62, No. 10, May 16, 1997.
Doucet, et al., "Palladium-Based Catalytic Systems for the Synthesis of Conjugated Enynes by Sonogashira Reactions and Related Alkynylations," Angew. Chem. Int. Ed. (2007) 46, 834.
Gareau, Y. et al. "Free Radical Reaction of Diisopropyl Xanthogen Disulfide with Unsaturated Systems," Heterocycles (1998) 48, p. 2003.
Gebauer, T. et al., "Mesoionic bora-tetraazapentalenes—fully reversible two step redox systems," Chemical Communications (2004), (16), 1860-1861.
Huang et al., "Synthesis of Perfluoro-2-alkynenitriles," Tetrahedron Letters (1981) 22, p. 5283.
Krebs et al., "Strained Cyclic Acetylenes, VII Addition of Sulfur and Pyridine-N-Oxide to Seven Membered Cycloalkynes," Heterocycles (1979) 12, p. 1153.
Krespan, C.G.; "Bis-(polyfluoroalkyl)-acetylenes. IV. Fluorinated Dithietenes and Related Heterocyclic Compounds From Bis-(polyfluoroalkyl)-acetylenes and Sulfur," J.Am. Chem. Soc. (1961) 83, 3434.
Lo, K. M., et al., "Synthesis and spectroscopic studies of thienyl triorganotin (IV) compounds," J. Organometal. Chem. (1992), 430, 149.

(Continued)

*Primary Examiner* — Charanjit Aulakh
(74) *Attorney, Agent, or Firm* — Sutherland Asbill & Brennan LLP

(57) ABSTRACT

Electronic components are provided that include a metal complex containing 2-(3-thienyl)-pyridine ligands. The metal complex may be used as a triplet emitter, and the electronic components include organic light-emitting diodes (OLEDs). The OLEDs may contain 2-20% of the metal complex, by weight.

9 Claims, 1 Drawing Sheet

OTHER PUBLICATIONS

Figure 1:
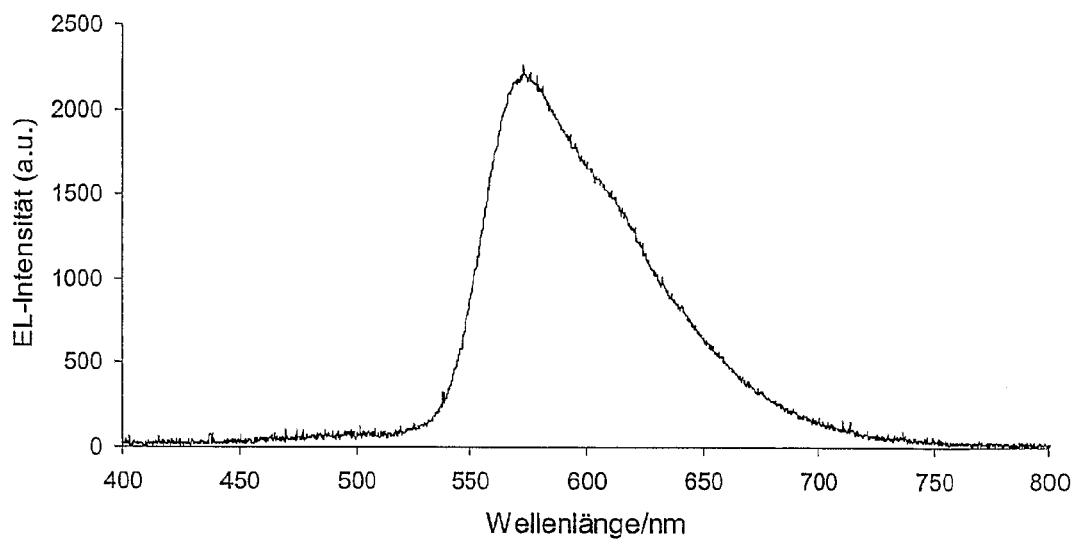

Marder et al., "Synthesis, Optical Properties, Crystal Stuctures and Phase Behavior of Selectively Fluorinated 1,4-bis(4'-pyridylethynyl)benzenes, 4-(phenylethynyl)pyridines and 9,10-bis(4'-pyridylethynyl)-anthracene, and a $Zn(NO_3)_2$ Coordination Polymer," J. Mater. Chem. (2004) 14, 2395.

Mayer, R., et al. "Synthese der 1,3-Dithiol-2-thione," Angew. Chem. (1964) 76, p. 143.

Nakayama, J. et al., "A Convenient Synthesis of 1,2-Dithietes and 1,2-Dithioxo Compounds Stabilized by Buttressing and Resonance Effects, Respectively, by Sulfuration of Alkynes with Elemental Sulfur," Bull. Chem. Soc. Jpn. (1993) 66, p. 623.

Okada, S. et al. "Substituent effects of iridium complexes for highly efficient red OLEDs," Dalton Trans., 2005, 1583.

Pereira, R. P. et al., "Electrosynthesis and characterization of polypyrrole doped with [Bi(dmit)2]<->," Synthetic Metals, Apr. 20, 2005, p. 21-26.

Pfeiffer, M. et al., "Controlled doping of phthalocyanine layers by cosublimation with acceptor molecules: a systematic Seebeck and conductivity study," Applied Physics Letters, vol. 73, No. 22 Nov. 20, 1998, pp. 3202-3204.

Schrauzer, et al. "Preparation, Reactions, and Structure of Bisdithio-α-diketone Complexes of Nickel, Palladium, and Platinum," J. Am. Chem. Soc. (1965) 87/7 1483-9.

Schrauzer, et al., "Reaktionen von Ubergangsmetallsulfiden mit Alkinen. Zur Kenntnis von Metallkomplexen der α-β-Dithiodiketone," Z. Naturforschg. (1964) 19b, 192-8.

Shinar, J. "Organic Light-Emitting Devices—A Survey," AIP-Press, Springer, New York 2004.

Sonogahsira, et al., "A Convenient Synthesis of Acetylenes: Catalytic Substitutions of Acetylenic Hydrogen with Bromoalkenes, Iodoarenes, and Bromopyridines." Tetrahedron Letters (1975) 50, 4467.

Sotoyama, W. et al. "Efficient organic light-emitting diodes with phosphorescent platinum complexes containing N-C-N-coordinating tridentate ligand," Appl. Phys. Lett. 2005, 86, 153505.

Taguchi, et al., "Comparison of p-type and n-type organic field-effect transistors using nickel coordination compounds," Chemical Physics Letters, Apr. 15, 2006, p. 395-398.

Tang, C.W. et al., "Organic electroluminescent diodes," Applied Physics Letters, vol. 51, No. 12, Sep. 21, 1987, pp. 913-915.

Tarraga, A. et al., "Synthesis and electrochemical study of novel and oxazolo-ferrocene ferrocene derivatives displaying redox-switchable character," Tetrahedron, 57, 31, Jul. 30, 2001, pp. 6765-6774.

Tung, Y. L. et al. "Organic light-emitting diodes based on charge-neutral Os(II) emitters: generation of saturated red emission with very high external quantum efficiency," J. Mater. Chem., 2005, 15, 460-464.

Yang, X. H. et al. "Polymer electrophosphorescence devices with high power conversion efficiencies," Appl. Phys. Lett. 2004, 84, 2476.

Yersin, H. and Donges, D. "Low-Lying Electronic States and Photophysical Properties of Organometallic Pd(II) and Pt(II) Compounds. Modern Research Trends Presented in Detailed Case Studies," Topics in Curr. Chem. (2001), 214, 81.

Yersin, H. "Highly Efficient OLEDs with Phosphorescent Materials," Wiley-VCH 2006.

International Search Report, International App. No. PCT/EP2007/006683, Nov. 13, 2007.

International Search Report, International App. No. PCT/EP2007/004638, Jul. 23, 2007.

International Search Report, International App. No. PCT/DE2006/002330, Apr. 24, 2007.

International Search Report, International App. No. PCT/DE2007/000587, Sep. 11, 2007.

European Office Action dated Oct. 13, 2010, for Corresponding European Patent Application No. 05 028 570.9.

Bonafede, Sandra, Electrogenerated Chemlluminescence of an Ortho-Metalated Platinum (II) Complex, J.Phys. Chem. 1986, pp. 3836-3841, vol. 90.

Chassot, L., Photochemical Preparation of Luminescent Platinum (IV) Complexes via Oxidative Addition on Luminescence Platinum (II) Complexes, J. Am. Chem. Soc. 1986, pp. 6084-6085, vol. 108.

Maestri, Mauro, Luminescence of Ortho-Metallated Platinum (II) Complexes, Chemical Physics Letters, Dec. 13, 1985, pp. 375-379, vol. 122, No. 4.

* cited by examiner

USE OF METAL COMPLEXES AS EMITTER IN AN ORGANIC LIGHT-EMITTING COMPONENT AND SUCH A COMPONENT

CROSS-REFERENCE TO RELATED APPLICATION

This is a submission pursuant to 35 U.S.C. 154(d)(4) to enter the national stage under 35 U.S.C. 371 for PCT/DE2006/002330 filed Dec. 22, 2006. Priority is claimed under 35 U.S.C. 119(a) and 35 U.S.C. 365(b) to European Patent Application No. 05028570.9 filed Dec. 28, 2005. The subject matters of PCT/DE2006/002330 and European Patent Application No. 05028570.9 are hereby expressly incorporated herein by reference.

The present invention relates to the use of metal complexes as emitter in an electronic component and this electronic component.

As is known in the art, electroluminescent compounds are the main feature of organic light emitting diodes. They are generally embedded in or chemically bound to monomeric, oligomeric or polymeric materials, which are generally of that kind, that in these materials suitable charge carriers are created and can be transported, with the provision that, upon collision of oppositely charged charge carriers, excitones are formed, which can transfer its excess energy to the respective electroluminescent compound. This electroluminescent compound can thereafter be transformed into a certain electronic excitation condition, which is then converted, preferably completely and with avoidance of radiationless deactivation processes, by light emission into the respective ground condition. As electronic excitation condition, which can be also formed by transmission of energy from a suitable precursor-exciton, a singlet or triplet-condition is considered, having only a few exceptions. As both conditions are, according to spin statistic, occupied generally in a ratio of 1:3, this results in the fact that in an emission from a singlet-condition, which is called fluorescence and predominantly occurs for organic, heavy metal free compounds, only a maximum of 25% of the excitation energy can be emitted. In contrast to that, in a triplet-emission, which is called phosphorescence and occurs predominantly for transition metal organyl-compounds, the whole amount of the excitation energy can be emitted (triplet-harvesting) so that in this case the light efficiency can reach 100%, as far as the simultaneously formed singlet condition lying energetically above the triplet condition is also emitted, is completely converted into the triplet condition and radiationless competition processes are without significance. Thus, triplet-emitters should be in general the more efficient luminophores, which are suitable to provide for a high light efficiency in organic light-emitting diodes.

As is known, despite intensive search for high efficient triplet emitters, only a few compounds are known, whose light efficiency is nearly 100%, as nearly always radiationless competition processes are simultaneously present with the desired phosphorescence. The known high efficient triplet-emitters are almost complexes of some heavy metals from the groups 6-10 of the Periodic System with specific, predominantly π-electron containing ligands, wherein these ligands are both bound to the respective heavy metal via primary— and secondary valences. It was found that for the known complexes the kind and strength of the metal-ligand bonding has an important influence to the interplay between radiationless and radiating desactivation and thus to the respective luminescence quantum efficiency, however, these features are hardly predictable for a specific compound.

As a consequence, the search for suitable triplet-emitters with luminescence quantum efficiency is more or less empiric. Thus, in most of the patent applications of the prior art all possible and suitable compounds of a specific structural type were contained.

In DE 102 51 986 A1 high efficient triplet-emitters are claimed, consisting of a central heavy metal atom, such as iridium or platin, being complexed with a different number of different 2-aryl or 2-heteroarylpyridines, respectively, as well as being partly complexed with additional bi- or monodentate ligands, wherein for the claimed 2-heteroarylpyridines 2-(2-thienyl)-pyridine is explicitly disclosed as ligand. However, an advantage of the use of this type of ligand in contrast to the ligands also disclosed is not explicitly disclosed. Detailed spectroscopic data for compounds of the above mentioned structural type were published from H. Yersin and D. Douges in Topics in Curr. Chem. 2001, 214, 81.

It is an object of the present invention, to overcome the advantages of the prior art, especially to provide electronic components, which can use high efficient emitter compounds. Especially the use of respective compounds with high luminescence quantum efficiency shall be possible, so that with these compounds organic light emitting diodes with high radiation performance and low degradation under long term conditions can be constructed.

This object is achieved by the use of a metal complex containing 2-(3-thienyl)-pyridine ligands as the emitter in an organic light-emitting component, wherein the metal complex is of general formula 1 or 2:

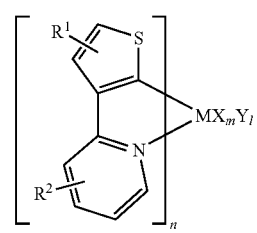

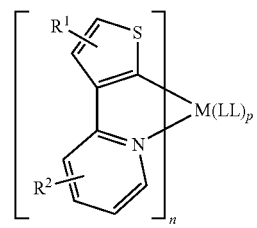

wherein M is a heavy metal, X, Y and LL are ligands, which independently of one another are charged or uncharged and from which essentially no emission comes, $R^1$ and $R^2$ independently of one another may be present one or more times on the respective cycle and are independently selected from F, Cl, Br, I, $NO_2$, CN, a straight-chain or branched or cyclic alkyl or alkoxy group with 1 to 20 carbon atoms, wherein one or more non-adjacent $CH_2$ groups may be replaced by —O—, —$SiR^3{}_2$—, —S—, —$NR^3$— or —$CONR^3$— and wherein one or more H atoms may be replaced by F, or an aryl or heteroaryl group with 4 to 14 C atoms, which may be substituted with one or more non-aromatic radicals $R^1$ or $R^2$; wherein a number of substituents $R^1$ and/or $R^2$, both on the same ring and on the two different rings, may together form a further monocyclic or polycyclic ring system;

$R^3$ is identical or different each time it occurs and is selected from H or an aliphatic or aromatic hydrocarbon radical with 1 to 20 carbon atoms; n=1-3, m and l independently of one another are 0-4 where 2n+m+l=4 or 6, or p=0–2 where 2n+2p=4 or 6.

The ligands X, Y und LL are such that from these essentially no emission comes, which, however, significantly influence the wave length of emission, duration of emission and quantum efficiency of emission as well as stability of the resulting complexes.

By specific combinations of ligands also negatively charged complexes of formula $[(3\text{-thienylpyridine})_n MX_m Y_l]^{q-}$ and $[(3\text{-thienylpyridine})_n M(LL)_p]^{r-}$ can be formed. For balancing the charge, metal cations $Me^{s+}$ (s=1–3) as well as ammonium and phosphonium salts can be utilized. The negatively charged complexes shall be enclosed within the scope of the present invention according to the formulas 1 and 2 as illustrated above.

Preferably, the heavy metal is selected from Pt(II), Pt(IV), Re(I), Os(II), Ru(II), Ir(I), Ir(III), Au(I), Au(III), Hg(I), Hg(II) and Cu(I).

In a further embodiment it is provided that X and Y independently of one another or ligands with a single negative charge or neutral monodentate ligand.

In this regard it is preferred that X and Y independently of one another are selected from $F^-$, $Cl^-$, $Br^-$, $I^-$, $CN^-$, $NCO^-$, $SCN^-$, $R^4S^-$, $R^4O^-$, $R^4C\equiv C^-$, $R^4COO^-$, $NO_3^-$, amine, phosphane, arsane, nitrile, isonitrile, CO, carbon, ether and thioether, wherein $R^4$ is an organic radical having 1 to 15 carbons, preferably alkyl.

In a further embodiment of the invention LL, preferably with single negative charge, is a chelating ligand and/or a cyclometallating ligand.

Especially preferred is that LL is selected from β-diketonate, β-diketoiminate, $[(\text{pyrazolyl})_2H]^-$, $[(\text{pyrazolyl})_2 BR^5_2]^-$, $[\text{pyrazolyl}_3BH]^-$, $[\text{pyrazolyl}_4B]^-$, $(\text{triazolyl})_2BH_2^-$, $(\text{triazolyl})_3BH^-$, $(\text{triazolyl})_4B^-$, $(Ph_2PCH_2)_2BR^5_2^-$, $R^5COO^-$, $NO_3^-$, diamine, diphosphane, diarsane, dinitrile, diisonitrile, dialkylether and dialkyl(thio)ethers, wherein $R^5$ is an organic radical with 1-15 carbon atoms, preferably alkyl.

Especially preferred is that the metal complex is used as a triplet emitter

According to the invention is also an electronic component, which contains a metal complex as described above.

It is preferably an electronic component in the form of an organic light-emitting diode (OLED).

Further, an electronic component is provided, wherein the organic light-emitting diode contains the complex, preferably in an electron transporting layer, in a concentration of 2-20 weight percent, preferably 5-8 weight percent.

Surprisingly it was found that by the use of the disclosed heavy metal complexes with 2-(3-thienyl)-pyridine ligands instead of 2-(2-thienyl)-pyridine especially in organic light-emitting diodes significantly improved luminescence quantum efficiencies are possible and thus the radiation performance of the organic light-emitting diode can be significantly improved. Additional advantages of the disclosed heavy metal complexes are the good sublimability as well as the possibility to vary the emission range and thus the detectible colours of the light emitting diodes in a great extent by the structural variation of the organyl-ligands.

The metal complexes according to the general formulas 1 and 2 used as emitters can be prepared according to known methods, starting from a suitable heavy metal compound, such as a heavy metal halide, heavy metal acetate or heavy metal nitrate, wherein this compound is either directly reacted with 2-(3-thienyl)-pyridine or is reacted after its preceding activation in the form of a suitable alkali metal compound or a respective metal organic derivative, such as a trialkyl stannyl, alkyl cupryl or alkyl zincate compound. Depending on the type of the starting components utilized, the reaction conditions chosen and the respective stoichiometric ratio of the respective components, complexes can be obtained which have due to this specific structural feature an extremely high phosphorescence quantum efficiency.

This is for example given for the compounds $Ir(3\text{-thpy})_3$ and $Pt(3\text{-thpy})_2$. The iridium compound can be prepared according to the disclosure of K. M. Lo et al. in *J. Organometal. Chem.* 1992, 430, 149 in that 2-(3-thienyl)-pyridine is converted by reaction with butyllithium into the respective lithium compound, which is subsequently reacted in situ with anhydrous $IrCl_3$ in THF, resulting in the desired iridium complex, which is subsequently isolated by precipitation with water and purified by column chromatography using silicagel and toluene as eluent. The iridium complex formed is provided as orange-yellow solid which thermally stable up to 250° C., and which can be evaporated without any decomposition under high vacuum at a temperature of less than 220° C. The structure thereof is confirmed as $\text{fac-Ir}(3\text{-thpy})_3$ by its mass number of m/z=655 and $^1$H-NMR-spektrum with signals at 8.63, 8.43, 8.14, 7.85, 7.77 and 7.4 ppm. It seems that for preparing the compounds which are suitable for the intended use special reaction conditions are necessary, for example lithium organic intermediates.

In an analogous manner, according to the disclosures of L. Chassot and A. von Zelewsky in *Inorg. Chem.* 1987, 26, 281, the compound $\text{trans-PtCl}_2(\text{SEt})_2$ can be prepared from one equivalent of $\text{trans-PtCl}_2(\text{SEt})_2$ and two equivalents of the above disclosed lithiated 2-(3-thienyl)-pyridine, which is obtained as dark red solid having a maximum in the red spectral range at about 600 mm, which is intensively luminescent and which can be evaporated thermally up to a temperature of about 300° C. under high vacuum without any decomposition. The compound crystallizes in a monocline lattice of room group P 21/n with lattice constants of a=1217.74 pm, b=1043.77 pm, c=1225.36 pm, α=90°, β=100, 141° and γ=90°. Using this compound an organic light-emitting diode was constructed and the characteristics were tested.

Figure 2:
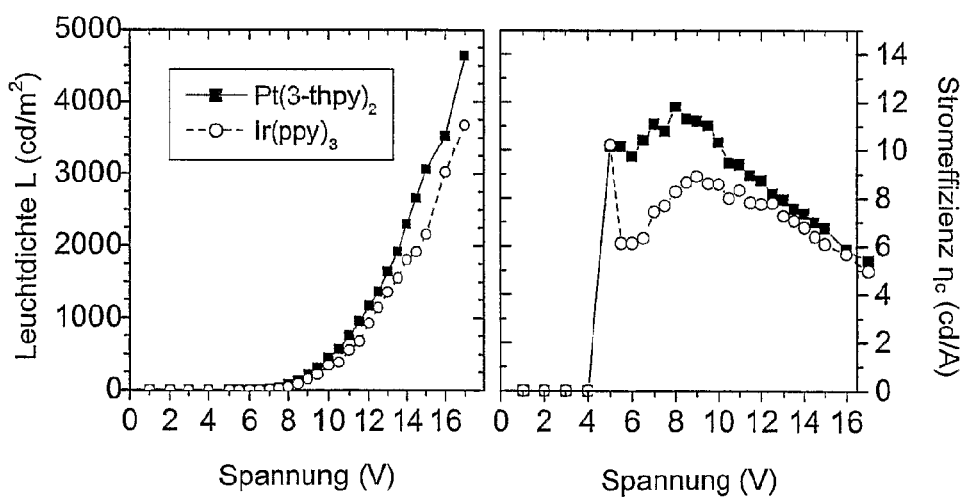

The present invention is now further illustrated with a detailed description of one embodiment in conjunction with the drawings as enclosed, in which FIG. 1 is an electroluminescence spectrum of an electronic component in which the respective metal complex is used according to the invention; and FIG. 2 shows luminance and efficiency characteristics of such a component and of a component utilizing $[Ir(ppy)_3]$ as emitter.

EXAMPLE

Organic light emitting diodes having the following configuration were designed and the properties tested.

A 100 nm layer of 4,4',4"-tris-[phenyl-(3-tolyl)-amino]-triphenylamine (mMTDATA), doped with 2% of 2,3,5,6-tetrafluoro-7,7,8,8-tetracyano-quinodimethane ($F_4$-TCNQ), a 20 nm layer of 4,4',4"-tris-(N-carbazolyl)-triphenylamine (TCTA), doped with 7% $\text{Ppt}(3\text{-thienylpyridine})_2$, a 40 nm layer of 3-(4-biphenyl)-4-phenyl-5-tert.-butylphenyl-1,2,4-triazole (TAZ), and a 0.5 nm layer of lithium fluoride and finally an aluminium electrode were successively evaporated on a glass support having a 50 nm ITO-layer.

The electroluminescence spectrum of the component obtained according to the design as disclosed above was measured and is provided in FIG. 1. It provides a performance efficiency of 400 lm/W and a quantum efficiency of about 4%. In FIG. 2 the luminance and efficiency characteristics of the above described OLED component are provided. These data were compared with a component which was prepared according to the identical process, which contains iridium trisphenylpyridine [Ir(ppy)$_3$] as emitter instead of the Pt(3-thienylpyridine)$_2$ as emitter. From FIG. 2, the advantages of the inventive use of the heavy metal complex having 2-(3-thienylpyridine) ligands can be taken.

The features disclosed in the foregoing description, in the drawings or in the claims may, both separately, and in any combination thereof, be material for realizing the invention in divers forms thereof.

What is claimed is:

1. An electronic component comprising an emitter, wherein the emitter comprises a metal complex containing one or more 2-(3-thienyl)-pyridine ligands, wherein the metal complex has a structure according to general formula 1 or 2:

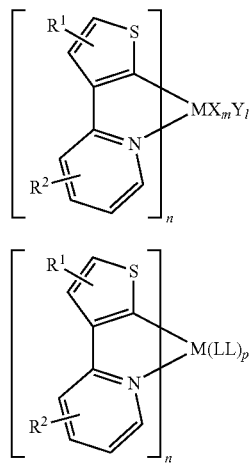

wherein M is a heavy metal; X, Y, and LL are ligands, wherein the ligands are independently charged or uncharged, wherein the ligands produce essentially no emission, wherein X and Y, independently of one another, comprise a single negative charge or neutral monodentate ligand, and are selected from the group consisting of F$^-$, Cl$^-$, Br$^-$, I$^-$, CN$^-$, NCO$^-$, SCN$^-$, R$^4$S$^-$, R$^4$O$^-$, R$^4$C≡C$^-$, R$^4$COO$^-$, NO$_3^-$, amine, phosphane, arsane, nitrile, isonitrile, CO, carbene, ethers, and thioethers, wherein R$^4$ is an organic radical with 1 to 15 carbon atoms, and wherein each LL comprises a chelating ligand and/or a cyclometallating ligand, and is selected from the group consisting of β-diketonate, β-diketoiminate, [(pyrazolyl)$_2$H]$^-$, [(pyrazolyl)$_2$BR$^5_2$]$^-$, [pyrazolyl$_3$BH]$^-$, [pyrazolyl$_4$B]$^-$, (triazolyl)$_2$BH$_2^-$, (triazolyl)$_3$BH$^-$, (triazolyl)$_4$B$^-$, (Ph$_2$PCH$_2$)$_2$BR$^5_2^-$, R$^5$COO$^-$, NO$_3^-$, diamine, diphosphane, diarsane, dinitrile, diisonitrile, dialkyl ethers, and dialkyl (thio)ethers, wherein R$^5$ is an organic radical with 1 to 15 carbon atoms;

R$^1$ and R$^2$, independently of one another, may be present one or more times on each respective cycle, and are independently selected from F, Cl, Br, I, NO$_2$, CN, a straight-chain alkyl, branched alkyl, cyclic alkyl, or alkoxy group, wherein the straight-chain alkyl, branched alkyl, cyclic alkyl, or alkoxy group comprises 1 to 20 carbon atoms wherein one or more non-adjacent CH$_2$ groups in the straight-chain alkyl, branched alkyl, cyclic alkyl, or alkoxy group may be replaced by —O—, —SiR$^3_2$—, —S—, —NR$^3$—, or —CONR$^3$— and wherein one or more H atoms in the straight-chain alkyl, branched alkyl, cyclic alkyl, or alkoxy group may be replaced by F, an aryl group, or heteroaryl group, wherein the aryl group or heteroaryl group comprises 4 to 14 C atoms, which may be substituted with one or more non-aromatic radicals R$^1$ or R$^2$; wherein two or more of substituents R$^1$ and/or R$^2$, both on the same ring and/or on the two different rings, may together form a further monocyclic or polycyclic ring system;

R$^3$ is identical or different each time it occurs and is selected from H, an aliphatic hydrocarbon radical, or aromatic hydrocarbon radical, wherein the aliphatic hydrocarbon or aromatic hydrocarbon radical comprises 1 to 20 carbon atoms;

wherein n is an integer from 1-3; wherein m and l, independently of one another, are integers from 0-4, wherein 2n+m+l=4 or 6, or p=0–2 and 2n+2p=4 or 6.

2. The electronic component according to claim 1, wherein the heavy metal is selected from the group consisting of Pt(II), Pt(IV), Re(I), Os(II), Ru(II), Ir(I), Ir(III), Au(I), Au(III), Hg(I), Hg(II), and Cu(I).

3. The electronic component according to claim 1, wherein the metal complex is a triplet emitter.

4. The electronic component according to claim 1, wherein the electronic component is an organic light-emitting diode (OLED).

5. The electronic component according to claim 4, wherein the organic light-emitting diode contains the metal complex in a concentration of 2-20 percent by weight.

6. The electronic component according to claim 1, wherein R$^4$ is an alkyl.

7. The electronic component according to claim 1, wherein LL has a single negative charge.

8. The electronic component according to claim 1, wherein R$^5$ is an alkyl.

9. The electronic component according to claim 5, wherein the organic light emitting diode contains the metal complex in a concentration of 5-8 percent by weight.

* * * * *